United States Patent [19]
Schulte et al.

[11] Patent Number: 5,115,911
[45] Date of Patent: May 26, 1992

[54] CARRIER TAPE SYSTEM

[75] Inventors: Richard D. Schulte, Arlington; Imran Malik, Lewisville; Richard K. Knight, Arlington, all of Tex.

[73] Assignee: Illinois Tool Works Inc., Glenview, Ill.

[21] Appl. No.: 650,077

[22] Filed: Feb. 4, 1991

[51] Int. Cl.$^5$ .................. B65D 73/02; B65D 85/30; B65D 43/04
[52] U.S. Cl. ..................... 206/330; 206/332; 206/390; 206/341; 206/343; 206/347; 206/538; 220/281
[58] Field of Search ............... 206/390, 330, 332, 341, 206/343, 344, 347, 534.1, 538, 539; 220/281

[56] References Cited

U.S. PATENT DOCUMENTS

| | | | |
|---|---|---|---|
| 3,111,220 | 11/1963 | Bostrom | 206/539 |
| 3,465,874 | 9/1969 | Hugle et al. | 198/131 |
| 3,523,608 | 8/1970 | Miller | 206/330 |
| 3,650,430 | 3/1972 | Siegmar et al. | 220/23.8 |
| 3,700,019 | 10/1972 | Robbins et al. | 150/3 |
| 3,894,896 | 7/1975 | Watanable | 206/538 |
| 3,910,410 | 10/1975 | Shaw | 206/363 |
| 4,298,120 | 11/1981 | Kaneko et al. | 206/329 |
| 4,708,245 | 11/1987 | Boeckmann et al. | 206/330 |
| 4,733,778 | 3/1988 | Boeckmann et al. | 206/332 |
| 4,736,841 | 4/1988 | Kanecko et al. | 206/332 |
| 4,842,135 | 6/1989 | Borst et al. | 220/281 |
| 4,844,258 | 7/1989 | Boeckmann et al. | 220/281 |
| 4,897,074 | 1/1990 | Knight | 493/381 |
| 4,958,053 | 9/1990 | Boeckmann et al. | 206/330 |

Primary Examiner—Paul T. Sewell
Assistant Examiner—M. D. Patterson
Attorney, Agent, or Firm—Schwartz & Weinrieb

[57] ABSTRACT

A carrier tape system includes an elongated base strip and an elongated cover strip both formed of a plastic film material. The cover strip is substantially coextensive in length with the base strip. The cover strip has a top surface and opposed sidewalls extending downwardly from the top surface. The opposed sidewalls are laterally spaced apart from each other a distance substantially equal to the width of the base strip. The cover strip further includes retaining means formed integrally therewith for mechanically engaging and holding down thin component parts seated within cavities formed within the base strip. The retaining means is comprised of either a ridge or a pair of laterally spaced apart rail members which are formed coextensive with the cover strip and which extend longitudinally, parallel to the sidewalls and which project downwardly from the top surface thereof.

20 Claims, 1 Drawing Sheet

U.S. Patent  May 26, 1992  5,115,911
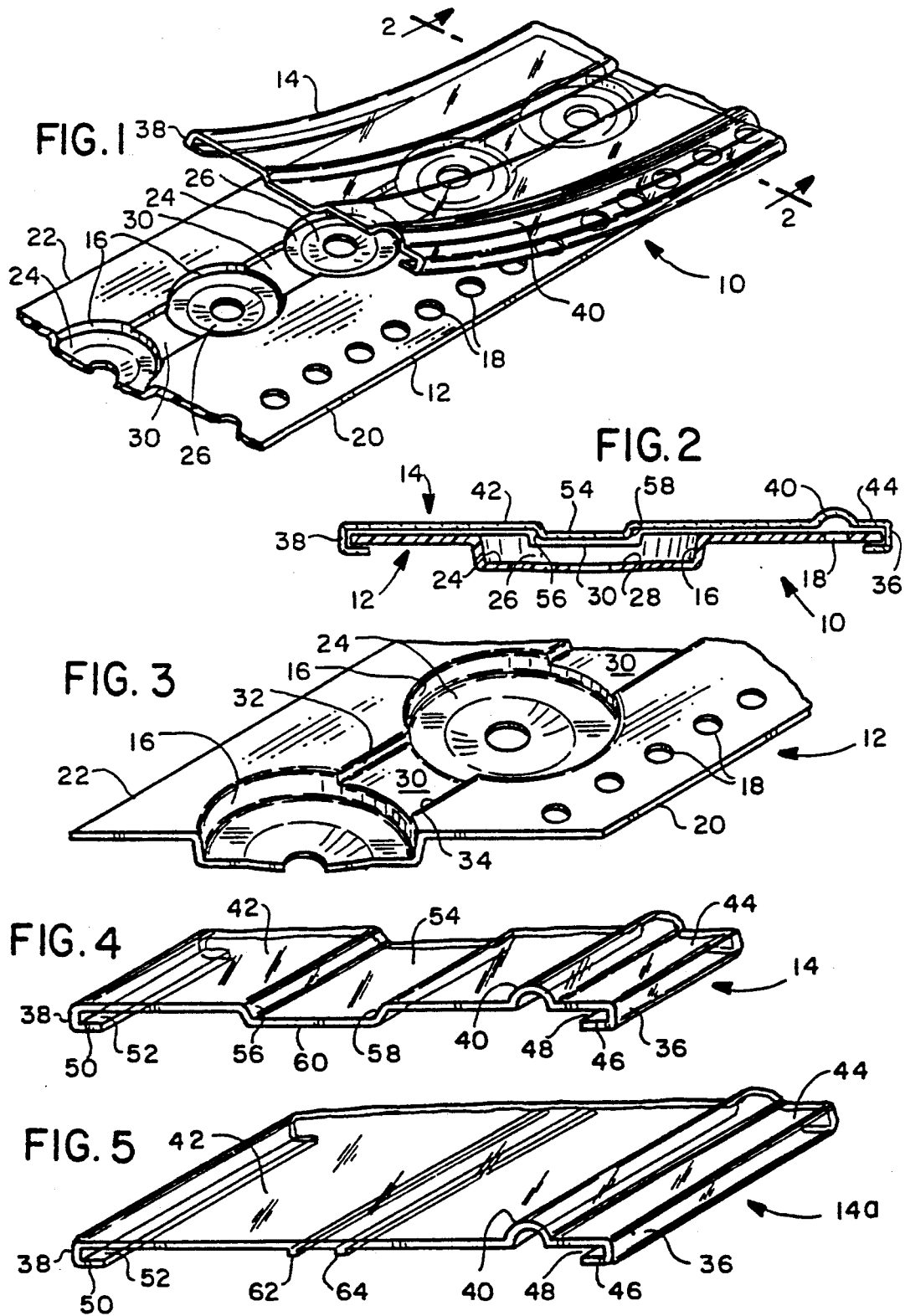

CARRIER TAPE SYSTEM

FIELD OF THE INVENTION

This invention relates generally to carrier tapes and more particularly, it relates to an improved carrier tape system for transporting electronic components, pharmaceuticals, and the like during production and assembly operations.

BACKGROUND OF THE INVENTION

As is generally well-known, carrier tapes are commonly used to transport miniature or subminiature components or products from one station to another station in connection with or during production and assembly operations. Such carrier tapes are typically formed of a base strip of plastic, paper or the like and a cover strip. The base strip is formed with a plurality of cavities or pockets for holding the components and the cover strip is secured to the base strip so as to avoid accidental discharge of the components from the cavities. Heretofore, the cover strip was most commonly held in place by means of an adhesive, heat bonded or spaced snap-type fasteners. Typical examples of these types of prior art carrier tapes are disclosed in U.S. Pat. Nos. 3,465,874; 3,650,430; 3,700,019; 3,894,896; 3,910,410; and 4,298,120.

In addition to the above patents, there are various prior art carrier tapes which utilize a continuous mechanical interlock for securing the base strip and the cover strip together. For example, in U.S. Pat. No. 4,733,778 to Hugo Boeckmann et al. issued on Mar. 1, 1988, and entitled "Reusable Carrier Tape," there is disclosed a carrier tape construction in which the base and cover strips are uniformly and consistently secured to each other. At least one of the strips is provided with an integrally formed, longitudinally extending continuous profile which cooperates with the surfaces of the other strip so as to secure the two strips together in a locking arrangement. In addition, in U.S. Pat. No. 4,708,245 to Hugo Boeckmann et al. issued on Nov. 24, 1987, and entitled "Carrier Tape," there is disclosed a carrier tape which includes an elongated base strip, an elongated cover strip, and at least one elongated profile strip bonded to one of the other strips, preferably the base strip. The profile strip is provided with a longitudinally extending, continuous, integrally formed profile which cooperates with the surfaces of the cover strip so as to secure the base and cover strips together in a locking engagement.

Furthermore, in U.S. Pat. No. 4,842,135 to Herbert A. Borst issued on Jun. 27, 1989, and entitled "Improved Carrier Tape and Cover Applying and Removal Devices For Same," there is disclosed an improved carrier tape comprising an elongated base strip and an elongated cover strip both formed of a plastic film material. The base strip is provided with longitudinally spaced cavities for housing components to be transported therein as well as a series of spaced, longitudinally extending sprocket drive holes for engaging suitable sprocket drive means for advancing the tape through an associated assembly machine. The cover strip has sidewalls extending downwardly and terminating in inwardly directed barbs or profiles. The spacing between the sidewalls is substantially equal to the width of the base strip. A raised, longitudinally extending hump is provided so as to project upwardly from the top surface of the cover strip. When the hump is depressed, the sidewalls of the cover strip move laterally outwardly so as to clear the edges of the base strip and thus permit removal of the cover strip therefrom. On the other hand, when the hump is released, the sidewalls return to their relaxed positions securely interlocking the cover strip with the base strip edges.

Furthermore, in U.S. Pat. No. 4,958,053 to Hugo Boeckmann et al. and entitled "Carrier Tape and Method of Manufacturing the Same," there is disclosed a carrier tape having a cover strip and a base strip formed of a plastic material and designed to mechanically interlock with each other. The cover strip includes a top surface from which sidewalls extend downwardly. At least one of the sidewalls includes a segment extending outwardly away from the other sidewall so as to define a camming surface to which a force may conveniently be applied so as to urge the sidewalls apart, thereby facilitating removal of the cover strip from the base strip. The cover strip may further also be provided with a hump having a dovetail configuration.

Finally, in U.S. Pat. No. 4,897,074 to Richard K. Knight and entitled "Mechanism For Joining a Carrier Tape Cover to a Base Strip," there is disclosed a carrier tape system which includes an elongated base strip and an elongated cover strip both formed of a plastic film material. The cover strip is substantially coextensive in length with the base strip. The cover strip has a top surface and opposed sidewalls extending downwardly from the top surface. The opposed sidewalls are spaced apart from each other a distance substantially equal to the width of the base strip. The cover strip further includes a hump projecting upwardly from the top surface and extending longitudinally in a parallel relationship with respect to the sidewalls. Each of the sidewalls has an inwardly extending hooked portion formed integrally therewith. The hooked portion has its top surface disposed beneath the edge of the base strip so as to form a U-shaped recess so as to secure the cover strip to the base strip. All of the aforementioned U.S. Pat. Nos. 4,733,778; 4,708,245; 4,842,135; 4,958,053; and 4,897,074 are assigned to the same assignee as the present invention and are hereby incorporated by reference.

In use, the prior art carrier tapes are usually wound around a storage reel for shipping and handling. While the base strip is provided with cavities which are often contoured so as to hold the components in place, it has however been encountered heretofore that the components may still be moveable out of the cavities, especially when the components are small thin fragile parts, so as to be susceptible to physical and electrostatic discharge (ESD) damage as the carrier tape is wrapped onto the storage reel. As a result, the small thin parts tend to shift or move between the base and cover strips during the winding process, thereby causing them to prematurely fall out of the cavities. All of the various prior art methods of securing the base strip and the cover strip together previously discussed (both the adhesion technique and the mechanical interlock type) fail to effectively hold the small thin parts within the cavities of the base strip during the assembly operation.

OBJECT OF THE INVENTION

Accordingly, it would therefore be desirable to provide an improved carrier tape system in which the base strip has trough-like sections interconnected between the cavities, and the cover strip has retaining means for movement within the trough-like sections of the base strip so as to mechanically engage and hold down the components within the cavities of the base strip during wrapping of the carrier tapes around a storage reel.

Accordingly, it is a general object of the present invention to provide an improved carrier tape system having retaining means which is relatively simple and economical to manufacture and assemble, but yet overcomes the disadvantages of the prior art carrier tapes.

It is an object of the present invention to provide a carrier tape system which includes a base strip, and a cover strip having retaining means for mechanically engaging and holding down components disposed within cavities formed within the base strip.

It is another object of the present invention to provide an improved carrier tape system in which the base strip has trough-like sections interconnecting or extending between the cavities, and the cover strip has retaining means for movement within the trough-like sections of the base strip so as to mechanically engage and hold down the components disposed within the cavities of the base strip.

It is still another object of the present invention to provide an improved carrier tape system in which the cover strip has a ridge for mechanically engaging and pressing against the top surfaces of the components disposed within the cavities formed within the base strip.

It is yet still another object of the present invention to provide an improved carrier tape system in which the cover strip includes a pair of spaced-apart rail members for mechanically engaging and fitting tightly against the top surfaces of components disposed within the cavities formed within the base strip.

SUMMARY OF THE INVENTION

In accordance with these aims and objectives, the present invention is concerned with the provision of an improved carrier tape system which includes an elongated base strip and an elongated cover strip which is substantially coextensive in length with the base strip. The cover strip has a top surface and opposed sidewalls extending downwardly from the top surface. The opposed sidewalls are spaced apart from each other a distance substantially equal to the width of the base strip. The cover strip further includes retaining means formed integrally therewith for mechanically engaging and holding down the components disposed within the cavities formed within the base strip.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, and wherein:

FIG. 1 is a fragmentary, perspective view of a carrier tape system, constructed in accordance with the principles of the present invention;

FIG. 2 is a cross-sectional view of the carrier tape system of FIG. 1, taken along the lines 2—2;

FIG. 3 is a perspective view of the base strip of the carrier tape system of FIG. 1;

FIG. 4 is a perspective view of the cover strip of the carrier tape system of FIG. 1; and FIG. 5 is a perspective view of a second embodiment of a cover strip of the present invention.

DESCRIPTION OF THE PREFERRED EMBODIMENTS

Referring now in detail to the drawings, there is shown in FIGS. 1 through 4 an improved carrier tape system 10 which is constructed in accordance with the principles of the present invention. The carrier tape system 10 is comprised of an elongated base strip 12 and a generally coextensive cover strip 14. The carrier tape system 10 is preferably formed of a suitable plastic film material such as, for example carbon loaded polyvinyl chloride, polypropylene or a glycol-based polyester such as, for example polyethylene terephthalate (PETG) which may be readily extruded and vacuum or pressure formed to the desired shape. The carrier tape resin may be formulated with appropriate additives so as to render the base and cover strips anti-static or static dissipative as may be required. The improved carrier system 10 should be sufficiently flexible so as to permit it to be spooled or wound upon a storage reel.

The base strip 12 is formed with a plurality of cavities 16 which define individual pockets for the components to be conveyed thereby. In this regard, the cavities 16 may be contoured, as required, to maintain the component in a particular orientation, should such orientation be necessary. A series of aligned sprocket holes 18 is provided so as to extend through the base strip 12 at lateral position adjacent to and laterally outwardly of the oavities 16. The base strip 12 further inoludes a first edge 20 disposed laterally outwardly of the sprocket holes 18 and a second edge 22 disposed laterally of the cavities 16.

Furthemore, it will be noted that each of the cavities 16 is of a generally circular shape and is formed with annular support ledges 24 disposed about the interior circumference of the cavities. When the components 26 to be disposed within the cavities are small, thin fragile parts, such as, for example, metallic disc-shaped dome switch pads, only the periphery of the lower surface of each pad is supported by means of the support ledge 24 within the cavity so that the entire lower surface does not contact the bottom surface 28 of the cavity, thereby reducing the possibility of physical damage to sensitive parts or surface portions of the components 26.

The base strip 12 also includes a plurality of recesses or trough-like sections 30, each extending longitudinally between and interconnecting two adjacent cavities 16. The trough-like sections 30 serve to receive retaining means formed upon the cover strip 14 for disposition therein, as will be noted hereinafter. Each of the trough-like sections 30 is defined by means of vertical walls 32, 34 which are laterally spaced apart from each other by means of a distance which is less than the diameter of the cavities 16.

The cover strip 14 is coextensive in length with the base strip 12. The cover strip 14 is provided at each side, with downwardly extending sidewalls 36 and 38. These sidewalls 36, 38 are laterally spaced apart from each other by means of a distance which is substantially equal to the width of the base strip 12. The cover strip 14 also includes a longitudinally extending upwardly projecting hump 40 along its entire length. The hump 40 is used to provide a "living hinge" for major portion 42 and minor portion 44 of the top face of the cover strip 14 defined upon opposite sides of the hump.

The sidewall 36 has formed integrally therewith a laterally inwardly extending hooked portion 46. The undersurface of the cover strip 14 adjacent the sidewall 36 and the top surface of the hooked portion 46 form a continuous longitudinally extending U-shaped recess or slot 48. Similarly, the sidewall 38 has formed integrally therewith a laterally inwardly extending hooked portion 50. The undersurface of the cover strip 14 adjacent the sidewall 38 and the top surface of the hooked portion 50 form a continuous longitudinally extending U-shaped recess or slot 52.

The cover strip 14 also includes a longitudinally extending retaining means formed by means of a downwardly extending U-shaped depression or ridge 54 disposed substantially at the intermediate area of the major portion 42 of the strip 14. The ridge 54 is defined by means of laterally spaced apart vertical wall members 56, 58 joined together by a horizontally flat crossmember 60. When the base strip 12 with its cavities 16 thereof loaded with small thin parts 26 and the cover strip 14 are joined together in the assembled condition, the ridge 54 of the cover strip 14 will be disposed within the corresponding trough-like sections 30 of the base strip 12 so as to cause the lower surface of the flat crossmember 60 to mechanically engage and press against the top surfaces of the thin parts 26 seated within the cavities 16, as can best be seen from FIG. 2. As a consequence, the crossmember 60 of the ridge 54 serves to efficiently and effectively hold down the thin parts within the cavities and thus restricts any extraneous movement thereof. Therefore, the thin parts 26 are in this manner prevented from prematurely falling out of the cavities 16 during wrapping of the carrier tape system 10 around a storage reel for subsequent shipment and/or use.

The sizes of the U-shaped recesses 48 and 52 are such that when the cover strip 14 is mechanically interengaged with the base strip 12, the edges 20, 22 of the base strip are received within the recesses 48 and 50, as best seen from FIG. 2. Furthermore, in the assembled condition the hump 40 is positioned so as to be aligned over the line of sprocket holes 18 thereby providing clearance for the protruding teeth of a sprocket drive wheel of an assembly mechanism with which the carrier tape system 10 is to be used.

In FIG. 5, there is illustrated a second embodiment of a cover strip 14a in which the retaining means is comprised of a pair of laterally spaced apart projections or rail members 62, 64. The rail members 62, 64 extend downwardly from the lower surface of the major portion 42 at substantially its intermediate area. The rail members are spaced apart a distance which is approximately equal to the width of the crossmember 60 of FIG. 4. The rail members function in a similar manner as that of crossmember 60 for mechanically engaging and fitting tightly against the top surfaces of the thin parts seated within the cavities of the base strip, thereby precluding disengagement of the parts from the cavities during the assembly operation.

From the foregoing detailed description, it can thus be seen that the present invention provides an improved carrier tape system in which the base strip has trough-like sections interposed between the cavities and the cover strip has retaining means for disposition within the trough-like sections. The retaining means serves to mechanically engage and hold down the components disposed within the cavities of the base strip, thereby preventing the components from prematurely falling out of the cavities during wrapping of the carrier tape system around a storage reel. The retaining means is suitably formed of either a ridge or a pair of laterally spaced apart rail members.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A carrier tape system, comprising:
   an elongated base strip;
   an elongated cover strip coextensive in length with said base strip;
   said cover strip having a top surface and opposed sidewalls extending downwardly from said top surface, said opposed sidewalls being spaced apart from each other a distance substantially equal to the width of said base strip, and means for securing said cover strip to said base strip;
   said base strip having an upper surface for engaging said cover strip when said cover strip is secured to said base strip; a plurality of longitudinally spaced cavities, extending downwardly from said upper surface of said base strip, for housing a plurality of components therein; and a plurality of trough-like grooves extending longitudinally between and interconnecting adjacent ones of said plurality of cavities at a level beneath said upper surface of said base strip but above a bottom wall portion of each one of said cavities upon which each one of said components is supported; and
   retaining means extending downwardly from a lower surface of said cover strip so as to be disposed within said longitudinally extending trough-like grooves of said base strip when said cover strip is secured to said base strip and for engaging said components disposed within said cavities of said base strip so as to retain said components within said cavities of said base strip.

2. A carrier tape system as claimed in claim 1, wherein said retaining means comprises a ridge coextensive with said cover strip and extending longitudinally, parallel to said sidewalls.

3. A carrier tape system as claimed in claim 1, wherein said retaining means comprises a pair of spaced apart rail members coextensive with said cover strip and extending longitudinally, parallel to said sidewalls.

4. A carrier tape system as claimed in claim 1, wherein said cover strip includes a hump projecting upwardly from said top surface and extending longitudinally in a parallel relationship to said sidewalls.

5. A carrier tape system as claimed in claim 4, wherein said base strip further includes a plurality of longitudinally spaced sprocket holes defined therein adjacent said cavities.

6. A carrier tape system as claimed in claim 5, wherein said sprocket holes are aligned with said hump of said cover strip.

7. A carrier tape system as claimed in claim 6, wherein each of said sidewalls has an inwardly extending hooked portion formed integrally therewith, said hooked portion having its top surface spaced beneath the edge of said lower surface of said cover strip so as to form a U-shaped recess for housing an edge portion of said base strip so as to secure said cover strip to said base strip.

8. A carrier tape system, comprising:
an elongated base strip;
an elongated cover strip coextensive in length with said base strip;
said cover strip having a top surface and opposed sidewalls extending downwardly from said top surface, said opposed sidewalls being spaced apart from each other a distance substantially equal to the width of said base strip, and means for securing said cover strip to said base strip;
said base strip having an upper surface for engaging said cover strip when said cover strip is secured to said base strip; a plurality of longitudinally spaced cavities, extending downwardly from said upper surface of said base strip, for housing a plurality of components therein; and a plurality of trough-like grooves extending longitudinally between and interconnecting adjacent ones of said plurality of cavities at a level beneath said upper surface of said base strip but above a bottom wall portion of each one of said cavities upon which each one of said components is supported; and
retaining means extending downwardly from a lower surface of said cover strip so as to be disposed within said longitudinally extending trough-like grooves of said base strip when said cover strip is secured to said base strip and for engaging and presing against top surfaces of said components disposed within said cavities of said base strip so as to restrict any extraneous movement of said components and thus prevent said components from prematurely falling out of said cavities during wrapping of said carrier tape system around a storage reel.

9. A carrier tape system as claimed in claim 8, wherein said retaining means comprises a ridge coextensive with said cover strip and extending longitudinally, parallel to said sidewalls.

10. A carrier tape system as claimed in claim 9, wherein said ridge includes spaced apart vertical wall members joined together by a horizontal flat crossmember.

11. A carrier tape system as claimed in claim 8, wherein said retaining means comprises a pair of spaced apart rail members coextensive with said cover strip and extending longitudinally, parallel to said sidewalls.

12. A carrier tape system as claimed in claim 8, wherein said cover strip includes a hump projecting upwardly from said top surface and extending longitudinally in a parallel relationship to said sidewalls.

13. A carrier tape system as claimed in claim 12, wherein said base strip further includes a plurality of longitudinally spaced sprocket holes defined therein adjacent said cavities.

14. A carrier tape system as claimed in claim 13, wherein said sprocket holes are aligned with said hump of said cover strip.

15. A carrier tape system as claimed in claim 14, wherein each of said sidewalls has an inwardly extending hooked portion formed integrally therewith, said hooked portion having its top surface spaced beneath the edge of said lower surface of said cover strip so as to form a U-shaped recess for housing an edge portion of said base strip so as to secure said cover strip to said base strip.

16. A carrier tape system as set forth in claim 1, whrein:
said cover strip comprises a resilient plastic material.

17. A carrier tape system as set forth in claim 2, wherein:
said ridge includes spaced apart vertical wall members joined together by means of a horizontaslly disposed flat crossmember.

18. A carrier tape system as set forth in claim 8, wherein:
said cover strip comprises a resilient plastic material.

19. A carrier tape system as set forth in claim 1, wherein:
each of said cavities has a circular configuration having a predetermined diametrical extent and with the axes of said circular cavities being disposed in a linear array; and
said trough-like grooves have a width which is less than said diametrical extent of said cavities and are disposed in a linear array which has a longitudinal axis which is coincident with a longitudinal axis of said linear array of said circular cavities.

20. A carrier tape system as set forth in claim 8, wherein:
each of said cavities has a circular configuration having a predetermined diametrical extent wherein the axes of said circular cavities are disposed in a linear array having a first longitudinally extending axis; and
said trough-like grooves have a width which is less than said diametrical extent of said cavities and are disposed in a linear array having a second longitudinal axis which is coincident with said first longitudinal axis of said linear array of said circular cavities.

* * * * *